Sept. 10, 1968 J. L. LANGDON ETAL 3,401,055

VAPOR DEPOSITING SOLDER

Filed Dec. 31, 1964

INVENTORS
JACK L. LANGDON
CLARENCE KARAN
RAYMOND P. PECORARO
PAUL A. TOTTA

BY B. A. Meany

AGENT

1

3,401,055

VAPOR DEPOSITING SOLDER

Jack L. Langdon, Wappingers Falls, Clarence Karan, Poughkeepsie, Raymond P. Pecoraro, Wappingers Falls, and Paul A. Totta, Poughkeepsie, N.Y., assignors to International Business Machines Corporation, New York, N.Y., a corporation of New York Filed Dec. 31, 1964, Ser. No. 422,586
3 Claims. (Cl. 117—212)

ABSTRACT OF THE DISCLOSURE

A method of depositing solder onto a plurality of small areas simultaneously to produce planar, relatively thick (1½ to 2 mils) coatings. A mask is located between the substrate and the solder source. The atmosphere about the substrate is evacuated, and the solder is evaporated from the source to the substrate through the mask. Cooling of the substrate is provided during the evaporation, to prevent melting of the deposited film.

This invention relates to material deposition and, more particularly, to a closely controlled process for depositing material onto a plurality of small areas simultaneously.

Electronic circuit technology has been characterized in recent years by a trend towards miniaturization of components. This trend has been extended to the individual circuit elements themselves. A plurality of logical elements have been positioned upon a single substrate so as to provide an integral circuit package capable of accomplishing a number of logical functions. Now, a plurality of these logical elements are even provided in a single package.

For example, it is possible currently to fabricate great numbers of discrete semiconductive logical devices within a single slab of semiconductor material. This is accomplished by properly doping certain areas of the semiconductor slab material. However, it is generally necessary to provide individual electrical contacts upon the individual logical elements built into such a single slab. In extreme situations, it becomes necessary to provide literally thousands of such electrical contacts upon the semiconductor slabs, and these slabs have overall areas measured in square inches or fractions thereof. These contacts therefore may have diameters measured in thousandths of an inch.

In an actual working environment, these semiconductor slabs are to be attached as a unit to certain supporting substrates having conductive paths on them. It has proved desirable in the prior art to combine the function of electrical contacts with that of mechanical support. That is, the joint providing electrical conductivity between the contact region on the semiconductor slab and an electrical path on the supporting substrate should also provide the mechanical connection between the semiconductor slab and the substrate.

In order to accomplish that combined function of electrical contact and mechanical support, a number of approaches and materials were considered and discarded. One approach which offered promise was the utilization of solder to connect the contact areas and regions immediately contiguous to the contact areas (hereafter jointly called land patterns) on the semiconductor slab and the conductive paths on the supporting substrate. To accomplish this, it was necessary to form a film of solder on the land patterns. The solder film had to be not only small in area, but relatively thick. The semiconductor slab and the supporting substrate are then brought into physical contact; by heating them, electrical conductivity and mechanical support is established between the land pat-

2 terns on the slab and the conductive paths, or similar land patterns, on the substrate.

Fabricating a film of solder having a relative thickness, yet a dimensional uniformity, proved to be difficult. Dip soldering techniques were tried, but the resultant coating lacked uniformity. Further, in many instances the semiconductor slabs had a protective glass coating surrounding surfaces other than the land patterns—and the heat of the dip soldering process introduced thermal stresses into the protective glass coating. Eventually, the coating cracked.

As an alternative to the dip soldering process, the conventional silk screening process was tested. The land areas to be coated were only a few thousands of an inch in diameter. Thus, it was impossible to consistently obtain sufficiently good definition of the solder coating; that is, solder would frequently spread out from individual land patterns and join similarly spreading solder from other land patterns. Undesirable interconnections would then be effected.

Similarly, the state of the art gave every indication that vapor deposition techniques would not prove successful here. Those techniques were normally associated with the formation of extremely thin films of materials; by contrast, it was desired here to fabricate a relatively thick film of solder. It would not appear feasible then to use vapor deposition as a means of fabricating the solder on the substrate.

The prior art then was faced with the problem of fabricating a uniformly dimensioned, relatively thick coating of solder simultaneously on great numbers of unusually small areas so as to continue the advance of semiconductor device and packaging technology—and it had not satisfactorily solved this problem.

Accordingly, it is a general object of this invention to eliminate the disadvantages associated with the prior art.

A more particular object of this invention is to provide a material deposition process offering a resultant thick film having uniform properties.

Another object of this invention is to provide a material deposition process offering a resultant film having a relative thickness whose thickness, as well as area, has dimensional uniformity.

It is another object of this invention to provide such a material deposition process where the film thickness and area uniformity may be closely controlled.

Yet another object of this invention is to provide such a material deposition process wherein a plurality of individual resultant films may be formed simultaneously.

Still another object of this invention is to provide such a process wherein the individual resultant films have a uniform thickness and area.

A still further object of this invention is to accomplish the deposition of uniform thick films of material, while using apparatus normally associated with the deposition of thin films of material.

A more particular object of this invention is to provide a solder deposition process wherein a great number of particularly small land patterns may be simultaneously, and individually coated with unusually thick films of solder having uniform thickness.

A still further object of this invention is to accomplish such a solder film deposition with apparatus normally associated with the deposition of thinner films of solder.

Briefly stated, and in accordance with one aspect of the invention, we provide a method for simultaneously coating a plurality of conductive land patterns on a planar substrate with a uniformly thick coating of solder. That process includes locating a substrate bearing the land patterns on a first surface within a vacuum chamber and cooling that substrate. An apertured mask, whose apertures are geometrically disposed in a pattern corresponding to the geometric disposition of the land patterns on the substrate, is placed between the substrate and a heated solder source. Solder is then evaporated from the solder source and deposited, through the apertured mask, onto the land pattern on the substrate as the substrate is being cooled. Thus, a coating of solder being relatively thick and having dimensional uniformity, is placed on each of the individual land patterns.

The disclosed process offers a number of distinct advantages. It enables great numbers, even thousands, of extremely small land patterns (for example, roughly .006" in diameter) to be simultaneously coated with a dimensionally uniform solder film. The apparatus employed normally yields an extremely thin film of solder; that is, a film having a thickness of roughly 5,000 to 10,000 angstroms. However, when utilized in the disclosed process, a relatively thick film is formed, and the thickness of that film is roughly 500,000 angstroms. The resultant thickness provides both a greater resistance to subsequent cracking and a more plentiful supply of solder for the subsequent connection of the coated element to a supporting member. The cooling portion of the process also offers a dual advantage. It eliminates the thermal stresses normally accompanying a dip solder process, and it also causes the solder film to solidify in a substantially planar shape—which is uniquely suited for the subsequent connection operation. The solder film is essentially planar in nature as opposed to hemispherical, the latter shape normally occurring when the substrate is at an elevated temperature as is common in prior art processes. This planar shape of the solder film—as opposed to the hemispherical shape resulting from deposition onto a noncooled substrate—forces the solder into a nonequilibrium state when melted; the solder then has a greater tendency to wet the surface of the supporting member or, in a more desirable application, to wet an interconnecting ball of conductive material. Perhaps of greatest significance, though, is the fact that vast numbers of these small solder films can be simultaneously fabricated, and the process repeated by merely inserting additional members to be coated.

In summary, then, the disclosed process lends itself well to the requirements of modern day mass production techniques wherein manufacturing processes should be economical and simple, as well as reliable, during repeated uses. And that is the nature of this process.

The foregoing and other objects, features and advantages of this invention will be apparent from the following more particular description of a preferred embodiment of the invention, as illustrated in the accompanying drawings.

Figure 1:
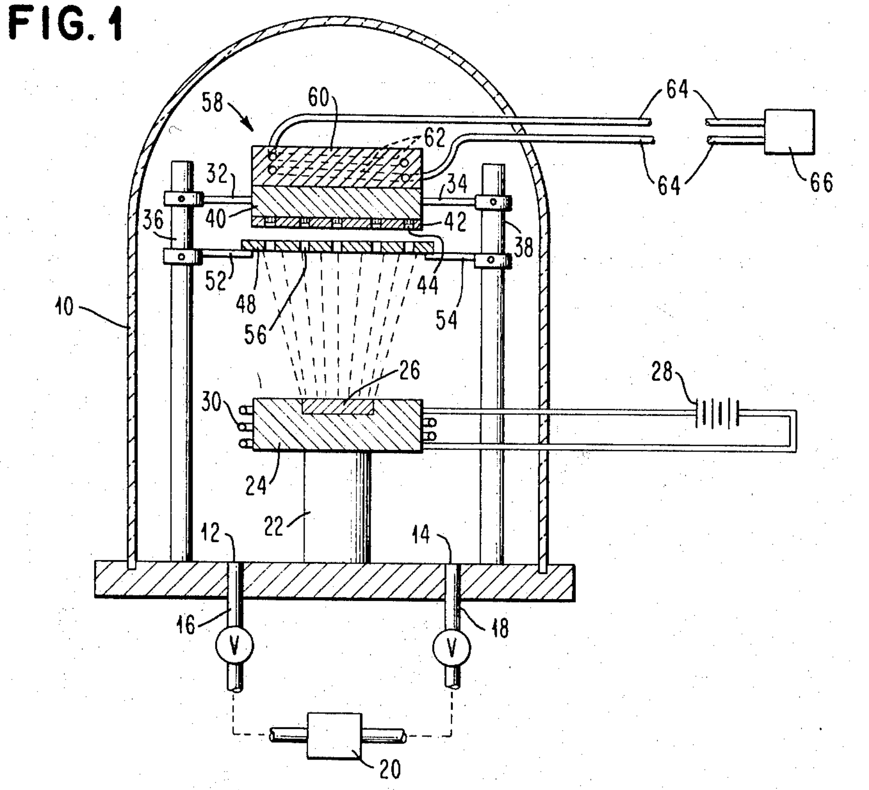
FIG. 1 shows apparatus utilized in practicing this invention.

FIG. 1 shows in some detail apparatus capable of practicing this invention. Vacuum chamber 10 has portals 12, 14 connected respectively through pipes 16, 18 to a source of vacuum 20. Seated on post 22 is a crucible 24 containing solder charge 26. Wrapped around crucible 24, and connected to current source 28, are a plurality of heating coils shown generally as 30. Disposed within supporting arms 32, 34 connected respectively to poles 36, 38 is substrate 40. Substrate 40 is normally a slab of semiconductor material, although, for example, it may be any rigid material bearing a number of conductive land patterns 46 to be coated with solder. Generally, substrate 40 will bear a protective glass coating 42 having apertures 44 therein. Located within each aperture is a conductive land pattern 46 and, if substrate 40 is a semiconductor wafer, those land patterns 46 will normally be part of an ohmic contact structure. However, it should be understood that substrate 40 need not be a semiconductor. The instant invention can be used to form a solder coating on a land pattern on any supporting substrate.

With continued reference to FIG. 1, an apertured mask 48 is placed between substrate 40 and crucible 24. Mask 48 is supported in a manner similar to substrate 40 by arms 52 and 54 connected to posts 36 and 38 respectively. Mask 48 has a plurality of apertures 56, and these apertures are axially aligned with apertures 44 in glass coating 42. Resting above substrate 40, and in contact with one surface thereof, is a cooling means shown generally as 58. Cooling means 58 may comprise, by way of example, a copper block 60 having a plurality of channels 62 within it. Channels 62 are connected by external tubing 64 which leads from the interior of vacuum chamber 10 through suitable seals, not shown, to an external source of cooling fluid 66.

In order to practice the process set forth herein, substrate 40 is positioned within vacuum chamber 10, and apertured mask 48 is aligned with substrate 40; it should be understood that the order of inserting and positioning these items may be reversed for convenience sake. Current is then supplied from source 28 through coils 30 so as to heat crucible 24. At the same time, cooling fluid is supplied from source 66 through tubing 64 and channels 62 in cooling block 60 so as to cool substrate 40 to room temperature or thereabouts. As crucible 24 is heated, the solder charge 26 begins to vaporize and particles of solder are then distributed upwards in a cone-shaped pattern. Being within a vacuum, the particles rise and pass through apertures 56 in mask 48, thereby depositing themselves on land patterns 46 on substrate 40. As will be described more fully by reference to FIG. 2, a film of solder having a substantially planar shape is thus deposited on land patterns 46.

The following process parameters have proved notably successful in simultaneously placing a 500,000 angstrom coating of solder on a plurality of land patterns having diameters of .006 of an inch. The vacuum level at the start of the evaporation process is somewhat less than $5 \times 10^{-5}$ millimeters of mercury. The substrate is positioned at a distance of approximately 6" from the source. The cone angle was roughly 30°, where the cone in question is formed by the three dimensional distribution of particles emanating from charge 26. A charge weight of 16½ grams +0, −.2 of 95% lead and 5% tin is employed. This charge is completely evaporated in 6 minutes. The resulting deposit thickness is 1½ to 2 mils. The temperature of substrate 40 varied from room temperature at the beginning of the deposition operation to a maximum of 100° C. Crucible 24, which is shown schematically in FIG. 1, has the geometry of a truncated cone, whose major diameter is 1", minor diameter is ½" and whose depth, or altitude, is ¼". Crucible 24 is fabricated from .0005" thick tantalum.

The description of process parameters and apparatus set forth above is not meant to be restrictive, but rather exemplary. Changes in apparatus and parameters may be made by one skilled in this art so as to accomplish the deposition of films of different thicknesses and/or different materials. Likewise, minor modifications may be made to certain aspects of the apparatus so as to prevent problems common to deposition arts; for example, the upper surface of mask 48 may be coated with a getter material such as titanium so as to prevent a pressure rise in the area between mask 48 and substrate 40 from attendant heating of the mask 48. Other minor modifications may be made without departing from the spirit of this invention.

Figure 2:
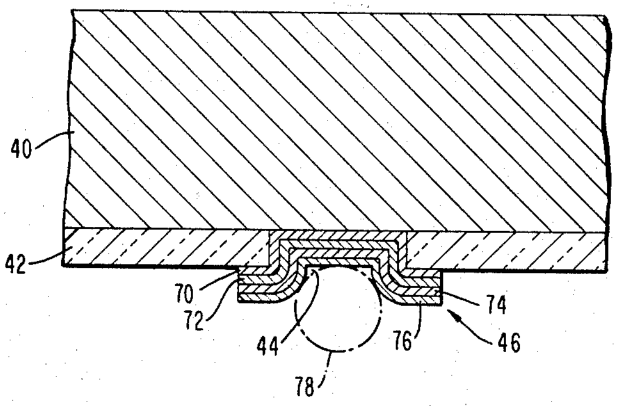
FIG. 2 shows, in cross section, a semiconductor wafer having a land pattern and a solder film formed thereon by the instant invention.

With reference to FIG. 2, an enlarged cross section of a substrate having a film of solder formed upon it by this process is shown. If substrate 40 is a slab of semiconductor material, film 42 would be a protective film of semiconductor oxide grown upon substrate 40. Disposed within an aperture 44 is an ohmic contact shown generally as 46. In actual practice, ohmic contact 46 may comprise an initial layer of chromium 70, covered with a layer of copper 72, and then a layer of gold 74. A layer of solder 76 is deposited by means of the instant invention above the gold layer 74. Note the planar shape of the solder. Shown in phantom is a ball 78 which may, by way of example, comprise either solder or copper, and is used to form electrical and mechanical connections between the solder and bearing contact and a supporting substrate. Such a procedure and structure is more fully described in copending U.S. application, Ser. No. 291,322 (series of 1960) and assigned to the same assignee as the instant application. Ball 78 may also be positioned through a mask and, upon removal of the mask coupled with application of heat, ball 78 will be connected to layer 76.

Figure 3:
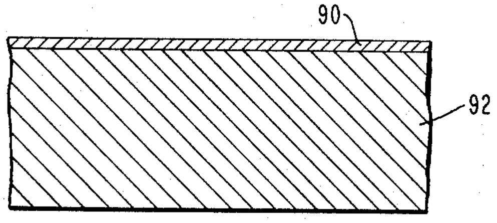
FIG. 3 shows in cross section the distribution of the lead and the tin in a solder film formed by this process.

FIG. 3 indicates, in cross section, the metallurgical characteristic of a solder film formed by this process. It has been noted that a solder film deposited by the instant process has a notably tin-rich outer layer; this is shown as layer 90 upon lead layer 92 in FIG. 3. Lead has a higher vapor pressure than tin. This may contribute to a fractional distillation effect during the evaporation procedure. That is, the initial evaporant deposited may be pure lead or at least contain significantly more lead than tin; by contrast, the final deposit may be pure tin, or a mixture significantly richer in tin than the initial deposit. This tin-rich layer enhances the soldering characteristics of the solder film so formed, and results in significantly better electrical and mechanical characteristics of the final soldered joint.

While the invention has been particularly shown and described with reference to a preferred embodiment thereof, it will be understood by those skilled in the art that the foregoing and other changes in form and details may be made therein without departing from the spirit and scope of the invention.

We claim:

1. A method of vapor deposition, comprising the steps of:

positioning within a vacuum chamber a substrate containing semiconductive devices having a plurality of conductive, noble metal land patterns, each said land pattern having lateral dimensions of the order of mils, said substrate being placed over a source of lead-tin solder;

masking said substrate with an apertured mask whose apertures are axially aligned with said land patterns;

evacuating the atmosphere around said substrate to a low vacuum;

vaporizing said lead-tin solder by heating said source of solder, the vaporized said solder being distributed toward said substrate in a cone shaped pattern having a total cone angle of less than approximately 30°;

simultaneously coating each said land pattern with substantially uniform planar films of lead-tin solder having a thickness of 1½ to 2 mils, each solder film having lateral dimensions in the order of mils; and cooling said substrate during the coating of said land patterns to a temperature of less than 100° C. to prevent said films of solder from melting, thereby forming solder films of substantially planar shape.

2. A method of vapor deposition, comprising the steps of:

positioning within a vacuum chamber a substrate containing semiconductive devices having a plurality of electrically conductive, metal land patterns each said land pattern having lateral dimensions of the order of mils, said substrate being placed over a source of solder;

masking said substrate with an apertured mask whose apertures are axially aligned with said land patterns;

evacuating the atmosphere around said substrate to a low vacuum;

vaporizing said solder by heating said source of solder, the vaporized said solder being distributed toward said substrate in a cone shaped pattern having a total cone angle of less than approximately 30°;

simultaneously coating each said land pattern with substantially uniform planar films of solder having a thickness of greater than about 1½ mils, each solder film having lateral dimensions in the order of mils; and cooling said substrate during the coating of said land patterns to a temperature of less than 100° C. to prevent said films of solder from melting, thereby forming solder films of substantially planar shape.

3. A method of vapor deposition, comprising the steps of:

positioning within a vacuum chamber a substrate containing semiconductive devices having a plurality of conductive, metal land patterns each said land pattern having lateral dimension of the order of mils, said substrate being placed over a source of lead solder;

masking said substrate with an apertured mask whose apertures are axially aligned with said land patterns;

evacuating the atmosphere around said substrate to a low vacuum;

vaporizing said lead solder by heating said source of solder, the vaporized said solder being distributed toward said substrate in a cone shaped pattern having a total cone angle of less than approximately 30;

simultaneously coating each said land pattern with substantially uniform planar films of lead solder having a thickness of greater than about 1½ mils, each solder film having lateral dimensions in the order of mils; and cooling said substrate during the coating of said land patterns to a temperature of less than 100° C. to prevent said films of solder from melting, thereby forming solder films of substantially planar shape.

References Cited

UNITED STATES PATENTS

| | | | |
|---|---|---|---|
| 3,023,727 | 3/1962 | Theodoseau et al. | 117—107.1 X |
| 3,230,109 | 1/1966 | Domaleski | 117—107 X |
| 3,253,331 | 5/1966 | Limanski | 117—107 X |
| 2,969,296 | 1/1961 | Walsh | 117—212 X |

ALFRED L. LEAVITT, *Primary Examiner.*

A. GOLIAN, *Assistant Examiner.*